US009106194B2

(12) United States Patent
Glebe et al.

(10) Patent No.: US 9,106,194 B2
(45) Date of Patent: Aug. 11, 2015

(54) REGULATION OF AUDIO VOLUME AND/OR RATE RESPONSIVE TO USER APPLIED PRESSURE AND RELATED METHODS

(75) Inventors: Dag Glebe, Södra Sandby (SE); Andrej Petef, Lund (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 67 days.

(21) Appl. No.: 13/203,900

(22) PCT Filed: Jun. 14, 2010

(86) PCT No.: PCT/IB2010/001451
§ 371 (c)(1),
(2), (4) Date: Aug. 30, 2011

(87) PCT Pub. No.: WO2011/158054
PCT Pub. Date: Dec. 22, 2011

(65) Prior Publication Data
US 2013/0077804 A1    Mar. 28, 2013

(51) Int. Cl.
*H03G 3/02* (2006.01)
*G06F 3/0488* (2013.01)

(52) U.S. Cl.
CPC ............... *H03G 3/02* (2013.01); *G06F 3/0488* (2013.01)

(58) Field of Classification Search
CPC ....... H03G 3/02; H03G 3/001; H03G 3/0088; G06F 3/0488; G06F 3/0481; G06F 3/03547; G06F 3/04847; G06F 3/0412; G06F 3/04855; G06F 3/04883; G06F 3/0414; G06F 3/04842; H04R 5/033; H04R 5/04; H04R 1/10

USPC ................... 381/104, 109, 345, 74, 306, 333; 345/168, 173; 455/200.1, 556.1
See application file for complete search history.

(56) References Cited

U.S. PATENT DOCUMENTS

| 2,360,862 | A | 10/1944 | Morris et al. |
|---|---|---|---|
| 2,901,433 | A | 8/1959 | Spring |
| 3,368,876 | A | 2/1968 | Bailey, Jr. |
| 3,637,727 | A | 1/1972 | Fujmoto et al. |
| 3,795,277 | A | 3/1974 | Ban et al. |
| 4,382,853 | A | 5/1983 | McCoy |
| 4,824,570 | A | 4/1989 | Bethuel et al. |
| 4,863,525 | A | 9/1989 | Goel et al. |
| 5,611,869 | A | 3/1997 | Hart |

(Continued)

FOREIGN PATENT DOCUMENTS

WO     WO 01/74966 A1     10/2001

OTHER PUBLICATIONS

Communication pursuant to Article 94(3) EPC for Application No. EP 03 743 244.0—2014 dated Jan. 19, 2009.

(Continued)

*Primary Examiner* — Vivian Chin
*Assistant Examiner* — David Ton
(74) *Attorney, Agent, or Firm* — Myers Bigel Sibley & Sajovec, PA

(57) ABSTRACT

An electronic device includes a force sensor that is configured to generate a force signal that indicates an amount of force being exerted thereon by a user, and a controller circuit that is configured to control a volume and/or rate that an audio signal is broadcast by a speaker responsive to the force signal.

11 Claims, 4 Drawing Sheets

(56) References Cited

U.S. PATENT DOCUMENTS

| | | |
|---|---|---|
| 5,720,825 A | 2/1998 | Kinnaird |
| 5,833,756 A | 11/1998 | Haegel et al. |
| 5,866,005 A | 2/1999 | DeSimone et al. |
| 5,944,996 A | 8/1999 | DeSimone et al. |
| 5,993,660 A | 11/1999 | Shook et al. |
| 5,993,975 A | 11/1999 | Tanaka et al. |
| 6,033,996 A | 3/2000 | Rath et al. |
| 6,096,699 A | 8/2000 | Bergemann et al. |
| 6,117,197 A | 9/2000 | Houser |
| 6,126,757 A | 10/2000 | Kinnaird |
| 6,173,776 B1 | 1/2001 | Furman et al. |
| 6,368,422 B1 | 4/2002 | Breuer et al. |
| 6,402,952 B2 | 6/2002 | McMurtrey et al. |
| 6,506,259 B1 | 1/2003 | Romack et al. |
| 6,511,601 B2 | 1/2003 | McMurtrey et al. |
| 6,702,903 B2 | 3/2004 | Kawakami et al. |
| 6,858,090 B2 | 2/2005 | Hebert |
| 8,212,790 B2 * | 7/2012 | Ribikauskas et al. ......... 345/173 |
| 8,560,947 B2 * | 10/2013 | Gillespie et al. ............. 715/702 |
| 2004/0056847 A1 * | 3/2004 | Yoshihara ..................... 345/173 |
| 2004/0259513 A1 * | 12/2004 | Park .......................... 455/200.1 |
| 2008/0259046 A1 * | 10/2008 | Carsanaro ..................... 345/173 |
| 2009/0140985 A1 * | 6/2009 | Liu ................................ 345/168 |
| 2009/0196436 A1 * | 8/2009 | Westenbroek ................ 381/104 |
| 2010/0137027 A1 * | 6/2010 | Kim ........................... 455/556.1 |

OTHER PUBLICATIONS

Publication: "The missing organic molecules on Mars", Steven A. Brenner et al. published in PNAS, Mar. 14, 2000, vol. 97, No. 6, pp. 2425, downloaded from the Internet on Jan. 23, 2010.

Publication: Developments in High Performance, Environmentally Friendly Corrosion Inhibitors for the Oilfield, Mark Gough et al, published in Corrosion 99, NACE conference, Apr. 25-30, 1999, San Antonio, TX, downloaded from the Internet on Jan. 22, 2010.

Letter comprising Specification for U.S. Appl. No. 09/534,172 to Kawakami et al., Mar. 24, 2000.

* cited by examiner

REGULATION OF AUDIO VOLUME AND/OR RATE RESPONSIVE TO USER APPLIED PRESSURE AND RELATED METHODS

RELATED APPLICATIONS

The present application is a 35 U.S.C. §371 national phase application of PCT International Application No. PCT/IB2010/001451, having an international filing date of Jun. 14, 2010, the disclosure of which is incorporated herein by reference in its entirety.

FIELD OF THE INVENTION

The present invention relates to mobile communication terminals and, more particularly, to methods and apparatus that provide user interfaces for changing volume and/or rate of an audio signal.

BACKGROUND

Smart phones and other electronic devices, such as the iPhone, have been developed that provide users with new and more efficient and/or intuitive ways to control phone functions. However, sound volume controls typically include at least two buttons and/or a volume bar that enables the user to press one button for increased sound, to press another button for decreased sound, and/or to select and move a volume control along a bar shaped icon between a high and low setting. Video speed controls generally work in the same manner between fast and slow playback speeds that allow a user to fast forward video or to view video in slow motion. These controls may take up valuable space on a touch sensitive screen and/or be difficult for a user to control during use, such as during a phone call.

SUMMARY OF EMBODIMENTS OF THE INVENTION

In some embodiments of the present invention, an electronic device includes a force sensor that is configured to generate a force signal that indicates an amount of force being exerted thereon by a user, and a controller circuit that is configured to control a volume and/or rate that an audio signal is broadcast by a speaker responsive to the force signal.

In some embodiments, the electronic device comprises a handheld communication device, the speaker is configured to be positioned adjacent an ear of a user during use, and the force sensor is sized and positioned on the device such that a user applies force to the force sensor when a user positions the speaker adjacent an ear. The controller circuit may be configured to control a volume that the audio signal is broadcast by the speaker responsive to the force signal. The controller circuit may be configured to increase a volume at which the audio signal is broadcast by the speaker when the force exerted by a user is increased. The controller circuit may be configured to maintain the increased volume at which the audio signal is broadcast when the force exerted by a user is reduced.

In some embodiments, the electronic device includes a display screen, and the display screen includes a touch sensitive display screen that is configured to identify a location thereon where a user is pressing, and the force sensor is configured so that the force signal corresponds to a force load applied to the screen by the user. The audio signal is synchronized with a video signal that is configured to be displayed on the display screen. The controller circuit is further configured to control the rate at which the audio signal is broadcast by the speaker and the video is displayed on the display screen responsive to the force signal. In some embodiments, the controller circuit is further configured to display a defined object at the location where the user is pressing against the touch sensitive display screen, is configured to decrease the size of the displayed object responsive to the force signal indicating that the user is pressing harder against the touch sensitive display screen, and is configured to increase the size of the displayed object responsive to the force signal indicating that the user is pressing less hard against the touch sensitive display screen. In some embodiments, the controller circuit is further configured to display a defined object at the location where the user is pressing against the touch sensitive display screen, is configured to increase the size of the displayed object responsive to the force signal indicating that the user is pressing harder against the touch sensitive display screen, and is configured to decrease the size of the displayed object responsive to the force signal indicating that the user is pressing less hard against the touch sensitive display screen.

In some embodiments, the controller is configured to maintain a current volume and/or rate that an audio signal is broadcast by the speaker when the force signal comprises a rapid cessation of force that indicates a user has released the force sensor.

In some embodiments, methods of controlling a volume and/or rate that an audio signal is broadcast by a speaker of an electronic device include generating a force signal that indicates an amount of force being exerted on a force sensor by a user. A volume and/or rate that an audio signal is broadcast by a speaker is controlled responsive to the force signal.

In some embodiments, the electronic device comprises a handheld communication device and the speaker is configured to be positioned adjacent an ear of a user during use. Force may be applied to the force sensor when a user positions the speaker adjacent the user's ear.

In some embodiments, the volume that the audio signal is broadcast by the speaker is controlled responsive to the force signal. A volume at which the audio signal is broadcast by the speaker is increased when the force exerted by a user is increased. The increased volume at which the audio signal is broadcast may be maintained when the force exerted by a user is reduced.

In some embodiments, the electronic device comprises a touch sensitive display screen that is configured to identify a location thereon where a user is pressing, and the force sensor is configured so that the force signal corresponds to a force load applied to the screen by the user. The audio signal may be synchronized with a video signal that is configured to be displayed on the display screen. The rate at which the audio signal is broadcast by the speaker and the video is displayed on the display screen may be controlled responsive to the force signal. A defined object may be displayed at a location where the user is pressing against the touch sensitive display screen. A size of the displayed object may be decreased responsive to the force signal indicating that the user is pressing harder against the touch sensitive display screen, and the size of the displayed object may be increased responsive to the force signal indicating that the user is pressing less hard against the touch sensitive display screen.

In some embodiments, a defined object is displayed at the location where the user is pressing against the touch sensitive display screen. A size of the displayed object is increased responsive to the force signal indicating that the user is pressing harder against the touch sensitive display screen, and the size of the displayed object is decreased responsive to the force signal indicating that the user is pressing less hard against the touch sensitive display screen.

In some embodiments, a current volume and/or rate that an audio signal is broadcast by the speaker is maintained when the force signal comprises a rapid cessation of force that indicates a user has released the force sensor.

In some embodiments, an electronic device comprises a touch sensitive display screen that is configured to identify a location where a user is pressing and to generate a force signal that indicates how hard the user is pressing. A controller circuit is configured to control a volume and/or rate that an audio signal is broadcast by a speaker responsive to the force signal.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF EMBODIMENTS OF THE INVENTION

Figure 1:
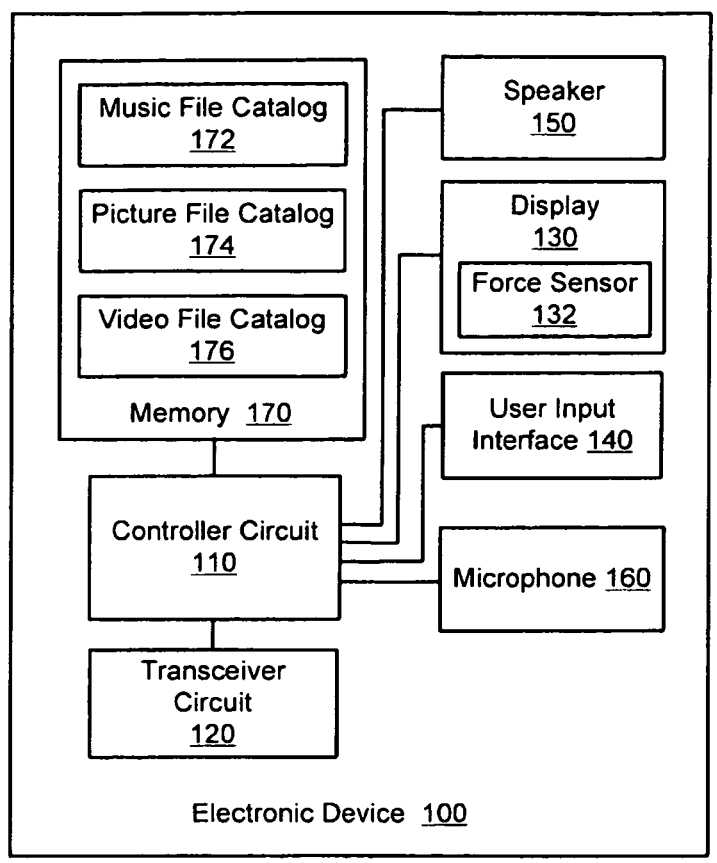
FIG. 1 is a block diagram of an electronic device that is configured to operate in accordance with at least some embodiments that are described herein.

The present invention will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/."

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

Exemplary embodiments are described below with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer-usable or computer-readable medium may be, for example but not limited to, an electronic, magnetic, optical, electromagnetic, or semiconductor data storage system, apparatus, or device. More specific examples (a non-exhaustive list) of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/BlueRay).

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Electronic devices, such as cellular phones and portable music/movie player devices, often have user interfaces that incorporate a touch screen for inputting information and/or making selections. In accordance with some embodiments, electronic devices can include a touch screen that provides both position sensing (e.g., X and Y axis information) along with force sensing (e.g., information in the Z direction) that identifies how much force a user is pressing against the screen at the sensed position. In some embodiments, a force sensor on a touch sensitive screen or a force sensor on another portion of the phone (such as a button or key) may be used to enable a user to control a volume and/or rate of audio data and/or video data. The rate may be a media playback speed of an audio signal via a transducer or of a video on a display. The user may thereby regulate how hard he/she is pressing the screen or force sensor to control the rate at which audio is played by a speaker or video is displayed on the display screen, and which may be carried out without substantial movement of the user's finger. Thus, the audio and/or video volume and/or rate may be controlled using a relatively small region of the device. Moreover, a force sensor may be positioned in a region of the device that contacts the user's ear when the device is in use. For example, the force sensor may be positioned adjacent a speaker such that when a user presses the speaker against the ear, the force sensor detects the force of the user's ear. A natural response to not being able to hear an audio signal is to press the device closer to the ear. In some embodiments, the volume of an audio signal may be increased when the user naturally presses the force sensor on the device adjacent the user's ear.

For purposes of illustration and explanation only, various embodiments of the present invention are described herein in the context of mobile communication terminals ("wireless terminals" or "terminals") that are configured to communicate through a cellular communication interface, a wireless local area network (WLAN) interface, and/or and Bluetooth wireless interface. It will be understood, however, that the present invention is not limited to such embodiments and may be embodied generally in any type of electronic device that plays an audio signal and/or displays a video and is configured to control a volume and/or rate of the video and/or audio signal responsive to an indication of how much force a user is exerting against the device, such as how hard the user is pressing a finger against screen or force sensor. Any suitable force sensor may be used, such as a transducer that converts an input mechanical force into an electrical output signal (e.g., a piezoelectric force transducer).

Figure 2:
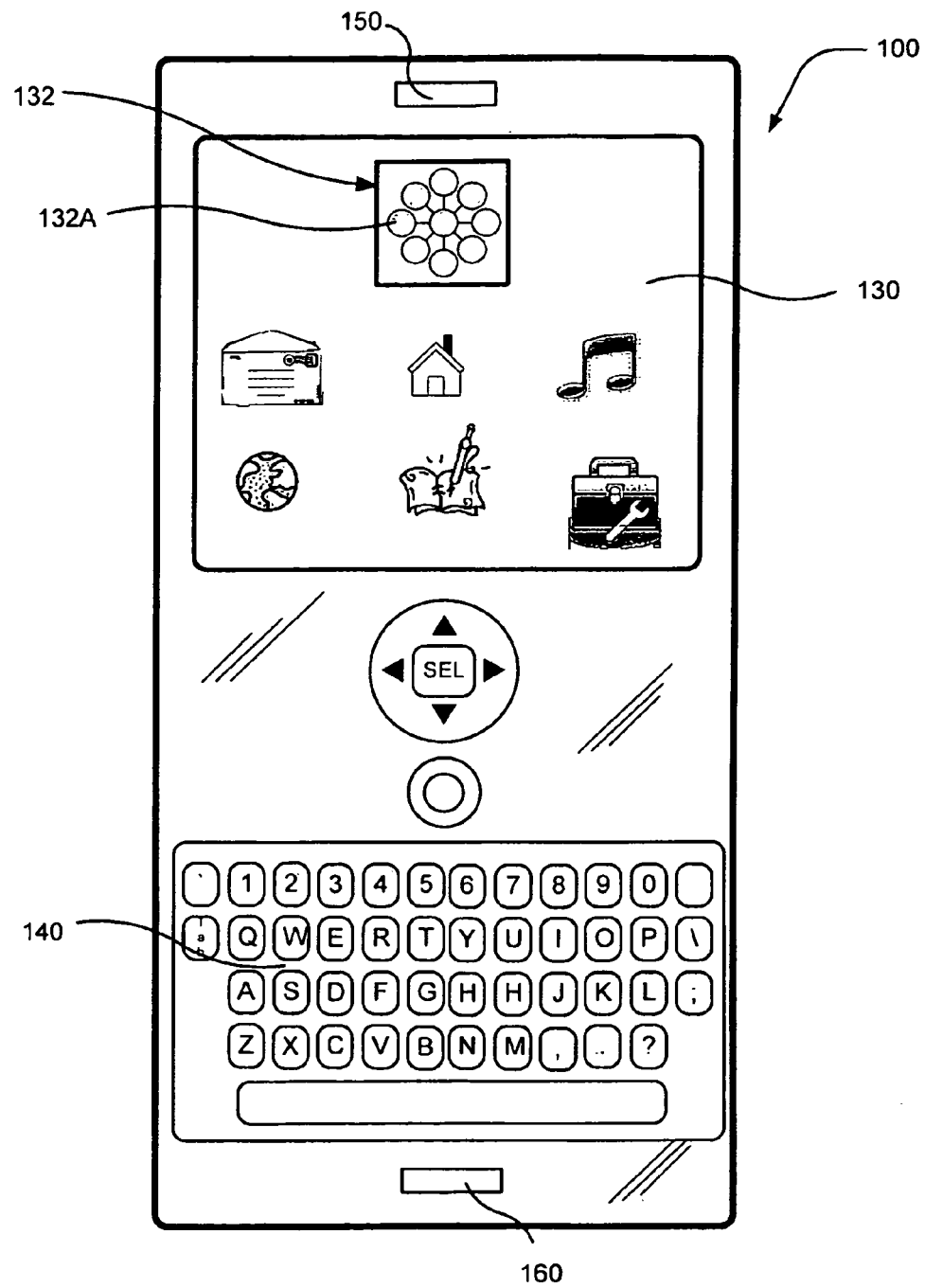
FIG. 2 is a front view of the electronic device of FIG. 1.

FIGS. 1-2 illustrate an exemplary electronic device 100 that may be configured to operate in accordance with at least some of the embodiments that are described herein. Although the electronic device has been illustrated as being a wireless communication terminal, the invention is not limited thereto and may be embodied in any type of device that is configured to sense an amount of force that a user is pressing against the device, and that is configured to control the volume and/or rate of an audio and/or video responsive to the sensed force. Although various embodiments have been described in the context of the electronic device sensing force that is exerted on the display screen, the device may alternatively or additionally be configured to sense and respond to how much force is applied to a button, joystick, keypad key, or other user interfaces of the device.

Referring to FIGS. 1-2, the exemplary electronic device 100 includes a controller circuit 110 and a display screen 130. The controller circuit 110 may include a general purpose processor circuit and/or a digital signal processor circuit that can execute instructions from a computer readable memory, which may reside therein or may be connected thereto, and/or a logic gate array configured to perform at least some of the operations and methods described herein. The display screen 130 may be a touch sensitive display screen that generates a location signal that indicate a location on the screen that is being touched by the user, and may include a force sensor 132 that is configured to generate a force signal that indicates how much force the user is exerting on the display screen 130 at that location. However, the force sensor 132 may be separate from the display screen 130. For example, the force sensor 132 may be part of the user input interface 140 and configured to generate a force signal that indicates an amount of force a user is exerting against a button, keypad key, or another part of the electronic device 100. For example, the force signal may be proportional or corresponding to an amount of load or force exerted against the force sensor. The electronic device 100 further includes a speaker 150, a microphone 160, and a transceiver circuit 120.

A memory circuit 170 can store a music file catalog 172 of digital music files, a picture file catalog 174 or digital pictures, a video file catalog 176 of digital videos, and/or other lists of information (e.g., email in an email folder, individual contact information within a contact list, action item lists) within the device that can be visually displayed on the display screen 130. The controller circuit 110 is configured to play an audio signal via the speaker 150 and/or to display on the display screen 130 a defined number of the items in one or more of the catalogs 172-176, and is configured to operate in accordance with one or more of the embodiments described herein, to control a speed/rate or volume at which it plays audio and/or video in response to how much force the force signal is indicating that the user is pressing against the display screen 130.

The transceiver circuit 120 may be configured to encode/decode and transmit and receive RF communications according to one or more cellular protocols, which may include, but are not limited to, Global Standard for Mobile (GSM) communication, General Packet Radio Service (GPRS), enhanced data rates for GSM evolution (EDGE), code division multiple access (CDMA), wideband-CDMA, CDMA2000, and/or Universal Mobile Telecommunications System (UMTS), WiMAX, and/or Long Term Evolution (LTE), and/or according to a WLAN (e.g., 802.11) and/or Bluetooth protocol.

The force sensor 132 may be positioned adjacent the speaker 150, which is positioned adjacent an ear of a user during use. Force may be applied to the force sensor 132 when a user positions the speaker 150 adjacent the user's ear.

The volume that the audio signal is broadcast by the speaker 150 may be controlled responsive to the force signal. The audio signal may be associated with a video and/or audio file, such as prerecorded music or other prerecorded audio, or the audio signal may be a real-time audio signal, such as a received signal from another communications device such as a telephone call. A volume at which the audio signal is broadcast by the speaker 150 may be increased when the force exerted by a user is increased. The increased volume at which the audio signal is broadcast may be maintained when the force exerted by a user is reduced or when the force signal indicates that the user has released the force sensor 132.

As shown in FIG. 2, the electronic device 100 includes a touch sensitive display screen 130 that is configured to identify a location thereon where a user is pressing. The force sensor is configured so that the force signal indicates a degree to which or how hard the user is pressing against the touch sensitive display screen 130. The audio signal may be synchronized with a video signal that is configured to be displayed on the display screen. The rate at which the audio signal is broadcast by the speaker 150 and the video is displayed on the display screen 130 may be controlled responsive to the force signal. A defined object, which is illustrated in FIG. 1 by a force sensor icon 132A, may be displayed at a location where the user is pressing against the touch sensitive display screen or at another location on the screen. The volume setting may be graphically indicated on the screen 130. For example, a size of the icon 132A may be changed responsive to the force signal, e.g., to indicate a corresponding volume change to an audio playback or a rate change to a video or audio playback rate. In some embodiments, the size of the icon 132A may be decreased responsive to the force signal indicating that the user is pressing harder against the touch sensitive display screen 130, and the size of the displayed object may be increased responsive to the force signal indicating that the user is pressing less hard against the touch sensitive display screen 130, e.g., a load on the screen. In some embodiments, the size of the displayed object is increased responsive to the force signal indicating that the user is pressing harder against the touch sensitive display screen 130, and the size of the displayed object is decreased responsive to the force signal indicating that the user is pressing less hard against the touch sensitive display screen 130.

Figure 3:
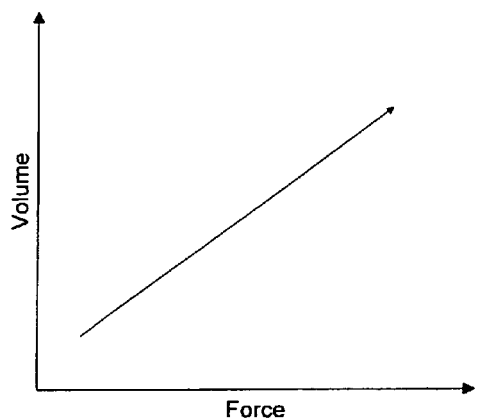
FIGS. 3-5 are graphs illustrating exemplary force response curves according to some embodiments that are described herein.
Figure 4:
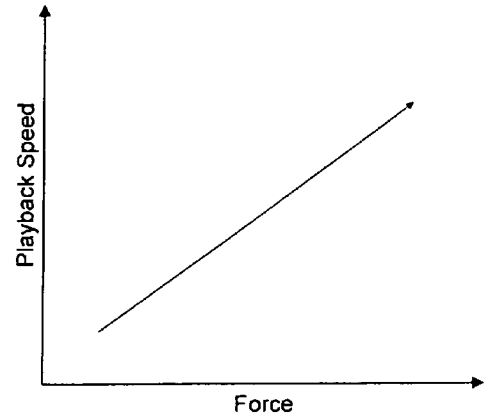

According to some embodiments of the invention, a volume and/or video playback rate may be controlled responsive to a force applied to the force sensor 132. Various volume and/or playback rate response curves may be used. As shown in FIG. 3, as a force applied to the force sensor 132 increases, the volume of the speaker 150 increases, and as shown in FIG. 4, as a force applied to the force sensor 132 increases, the playback rate of the video increases. Although FIGS. 3-4 illustrate a linear relationship between force and volume and/or video playback rate, it should be understood that any suitable response curve may be used. For example, the response of the volume and/or video playback rate may be unidirectional such that when the force is decreased, the volume and/or video playback rate is maintained at a level corresponding to the last recorded force sensed by the force sensor 132. Non-linear response curves may also be used.

Figure 5:
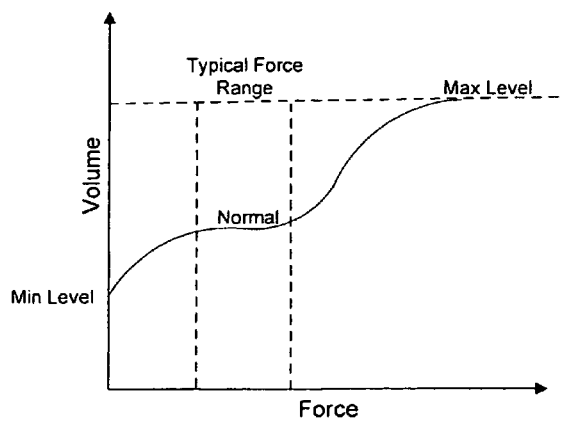

An exemplary response curve for a force sensor, e.g., that is positioned to contact a user's ear during use of the device, is shown in FIG. 5. As illustrated, the volume may be controlled by the force applied to the force sensor between a minimum and maximum level. When the user applies force to the force sensor in a prescribed range that would be normal during use of the device (a typical force range), the volume is maintained in a predetermined or normal range. When the user decreases the force on the force sensor below the prescribed typical force range, the volume is decreased. When the user increases the force on the force sensor above the typical prescribed force range, the volume is increased to a maximum level. It should be understood that the minimum and maximum prescribed levels may be predetermined settings in the phone or selected by a user. Although the regions above and below the normal or typical force range are illustrated as nonlinear, various response curves or linear response curves may be used.

Figure 6:
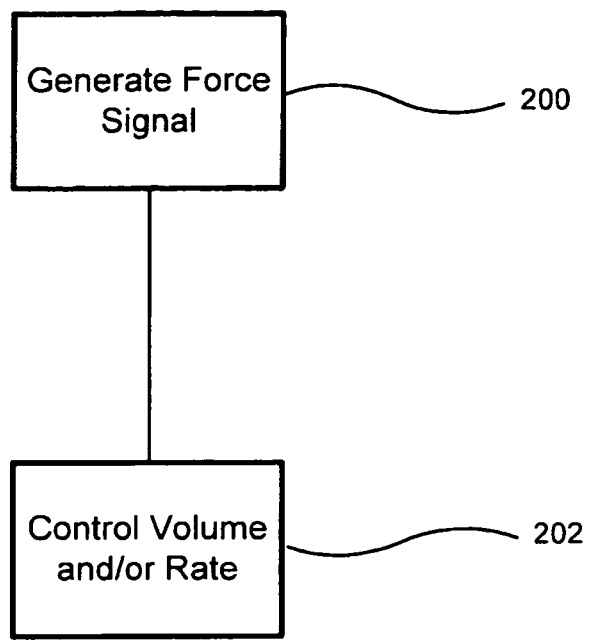
FIG. 6 is a flowchart illustrating operations according to some embodiments that are described herein.

As illustrated in FIG. 6, a force sensor as described herein is configured to generate a force signal responsive to a force exerted thereon by a user (Block 200). A volume and/or rate that an audio signal is broadcast by a speaker is controlled responsive to the force signal (Block 202).

Many alterations and modifications may be made by those having ordinary skill in the art in view of the present disclosure and without departing from the spirit and scope of the invention. Various embodiments of the present invention are, therefore, to be read to include not only the combination of elements which are literally set forth but all equivalent elements for performing substantially the same function in substantially the same way to obtain substantially the same result.

In the drawings and specification, there have been disclosed embodiments of the invention and, although specific terms are employed, they are used in a generic and descriptive sense only and not for purposes of limitation, the scope of the invention being set forth in the following claims.

What is claimed:

1. An electronic device comprising:
   a force sensor that is configured to generate a force signal that indicates an amount of force being exerted thereon by a user; and
   a controller circuit that is configured to control a volume and/or rate that an audio signal is broadcast by a speaker responsive to the force signal, wherein:
   the electronic device comprises a handheld communication device, the speaker is configured to be positioned adjacent an ear of a user during use, and the force sensor is sized and positioned on the device such that a user applies force to the force sensor when a user positions the speaker adjacent an ear; and
   the controller circuit is configured to increase a volume at which the audio signal is broadcast by the speaker when the force exerted by a user is increased, and the controller circuit is configured to maintain the increased volume at which the audio signal is broadcast when the force exerted by a user is reduced.

2. The electronic device of claim 1, the device further comprising:
   a display screen, wherein the display screen comprises a touch sensitive display screen that is configured to identify a location thereon where a user is pressing, and the force sensor is configured so that the force signal corresponds to a force load applied to the screen by the user;
   the audio signal is synchronized with a video signal that is configured to be displayed on the display screen; and
   the controller circuit is further configured to control the rate at which the audio signal is broadcast by the speaker and the video is displayed on the display screen responsive to the force signal.

3. The electronic device of claim 2, wherein:
   the controller circuit is further configured to display a defined object at the location where the user is pressing against the touch sensitive display screen, is configured to decrease the size of the displayed object responsive to the force signal indicating that the user is pressing harder against the touch sensitive display screen, and is configured to increase the size of the displayed object responsive to the force signal indicating that the user is pressing less hard against the touch sensitive display screen.

4. The electronic device of claim 3, wherein:
   the controller circuit is further configured to display a defined object at the location where the user is pressing against the touch sensitive display screen, is configured to increase the size of the displayed object responsive to the force signal indicating that the user is pressing harder against the touch sensitive display screen, and is configured to decrease the size of the displayed object responsive to the force signal indicating that the user is pressing less hard against the touch sensitive display screen.

5. The electronic device of claim 1, wherein the controller is configured to maintain a current volume and/or rate that an audio signal is broadcast by the speaker when the force signal comprises a rapid cessation of force that indicates a user has released the force sensor.

6. A method of controlling a volume and/or rate that an audio signal is broadcast by a speaker of an electronic device, the method comprising:

generating a force signal that indicates an amount of force being exerted on a force sensor by a user;
controlling a volume and/or rate that an audio signal is broadcast by a speaker responsive to the force signal, wherein the electronic device comprises a handheld communication device and the speaker is configured to be positioned adjacent an ear of a user during use, the method comprising:
applying force to the force sensor when a user positions the speaker adjacent the user's ear;
controlling a volume that the audio signal is broadcast by the speaker responsive to the force signal;
increasing a volume at which the audio signal is broadcast by the speaker when the force exerted by a user is increased; and
maintaining the increased volume at which the audio signal is broadcast when the force exerted by a user is reduced.

7. The method of claim 6, wherein the device further comprises:
a display screen, wherein the display screen comprises a touch sensitive display screen that is configured to identify a location thereon where a user is pressing, and the force sensor is configured so that the force signal corresponds to a force load applied to the screen by the user; and
the audio signal is synchronized with a video signal that is configured to be displayed on the display screen, the method further comprising:
controlling the rate at which the audio signal is broadcast by the speaker and the video is displayed on the display screen responsive to the force signal.

8. The method of claim 7, further comprising:
displaying a defined object at the location where the user is pressing against the touch sensitive display screen;
decreasing a size of the displayed object responsive to the force signal indicating that the user is pressing harder against the touch sensitive display screen; and
increasing the size of the displayed object responsive to the force signal indicating that the user is pressing less hard against the touch sensitive display screen.

9. The method of claim 8, further comprising:
displaying a defined object at the location where the user is pressing against the touch sensitive display screen;
increasing a size of the displayed object responsive to the force signal indicating that the user is pressing harder against the touch sensitive display screen; and
decreasing the size of the displayed object responsive to the force signal indicating that the user is pressing less hard against the touch sensitive display screen.

10. The method of claim 6, furthering comprising maintaining a current volume and/or rate that an audio signal is broadcast by the speaker when the force signal comprises a rapid cessation of force that indicates a user has released the force sensor.

11. An electronic device comprising:
a touch sensitive display screen that is configured to identify a location where a user is pressing and to generate a force signal that indicates how hard the user is pressing;
a controller circuit that is configured to control a volume and/or rate that an audio signal is broadcast by a speaker responsive to the force signal; and
the controller circuit is configured to increase a volume at which the audio signal is broadcast by the speaker when the force exerted by a user is increased, and the controller circuit is configured to maintain the increased volume at which the audio signal is broadcast when the force exerted by a user is reduced.

* * * * *